United States Patent
Na et al.

(10) Patent No.: US 11,209,557 B2
(45) Date of Patent: Dec. 28, 2021

(54) ARRAY SUBSTRATE FOR DIGITAL X-RAY DETECTOR, DIGITAL X-RAY DETECTOR INCLUDING THE SAME, AND METHOD FOR MANUFACTURING THE SAME

(71) Applicant: LG Display Co., Ltd., Seoul (KR)

(72) Inventors: Hyungil Na, Seoul (KR); Jungjune Kim, Seoul (KR); Hanseok Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/895,785

(22) Filed: Jun. 8, 2020

(65) Prior Publication Data

US 2020/0301029 A1    Sep. 24, 2020

Related U.S. Application Data

(62) Division of application No. 16/207,580, filed on Dec. 3, 2018, now Pat. No. 10,705,229.

(30) Foreign Application Priority Data

Dec. 5, 2017    (KR) .................. 10-2017-0165780

(51) Int. Cl.
*G01T 1/20* (2006.01)
*H01L 27/146* (2006.01)

(52) U.S. Cl.
CPC ...... *G01T 1/2018* (2013.01); *H01L 27/14612* (2013.01); *H01L 27/14663* (2013.01);
(Continued)

(58) Field of Classification Search
CPC ............ G01T 1/2018; H01L 27/14612; H01L 27/14663; H01L 27/14685; H01L 27/14689; H01L 27/14692; H01L 27/1462
See application file for complete search history.

(56) References Cited

U.S. PATENT DOCUMENTS

2007/0093007 A1* 4/2007 Deane .................. H01L 27/1214
438/154
2012/0305777 A1* 12/2012 Yamada ............ H01L 27/14663
250/361 R
(Continued)

FOREIGN PATENT DOCUMENTS

TW    200537691 A    11/2005
TW    201438204 A    10/2014

OTHER PUBLICATIONS

Office Action dated Aug. 28, 2019, in corresponding Taiwanese Patent Application No. 107141718.

*Primary Examiner* — Hugh Maupin
(74) *Attorney, Agent, or Firm* — Morgan, Lewis & Bockius LLP

(57) ABSTRACT

An array substrate for a digital X-ray detector, a digital X-ray detector including the same, and a method for manufacturing the same are disclosed. The array substrate reduces a step difference of a PIN diode, removes a bent part from a lower part to reduce characteristic deterioration of the PIN diode, and increases the size of a formation region of the PIN diode to increase a fill factor. To this end, the array substrate allows a source region of an active layer included in a thin film transistor to be in surface contact with a lower electrode of the PIN diode, and disposes the lower electrode over a planarized source region or a base substrate, such that a step difference of the PIN diode is reduced and fill factor is improved.

17 Claims, 15 Drawing Sheets

(52) U.S. Cl.
CPC .. *H01L 27/14685* (2013.01); *H01L 27/14689* (2013.01); *H01L 27/14692* (2013.01); *H01L 27/1462* (2013.01)

(56) References Cited

U.S. PATENT DOCUMENTS

2014/0103347 A1    4/2014  Ishino
2014/0284605 A1    9/2014  Tang et al.
2016/0313458 A1*  10/2016  Masuda ............ H01L 27/14612

* cited by examiner

ARRAY SUBSTRATE FOR DIGITAL X-RAY DETECTOR, DIGITAL X-RAY DETECTOR INCLUDING THE SAME, AND METHOD FOR MANUFACTURING THE SAME

CROSS-REFERENCE TO RELATED APPLICATIONS

This application is a Divisional Application of U.S. patent application Ser. No. 16/207,580, filed on Dec. 3, 2018, which claims the priority of Korean Patent Application No. 10-2017-0165780 filed on Dec. 5, 2017, in the Korean Intellectual Property Office, the disclosures of both of which are hereby incorporated by reference in their entirety.

BACKGROUND

1. Technical Field

The present disclosure relates to an array substrate for a digital X-ray detector, a digital X-ray detector including the same, and a method for manufacturing the same.

2. Discussion of the Related Art

A digital X-ray detector (DXD) refers to an apparatus capable of detecting the transmission amount (e.g., transmissivity) of X-rays passing through a subject and displaying internal images of the subject on a display. With the rapid development of digital technology, a digital X-ray detector based on a thin film transistor (TFT) has recently been developed and rapidly come into medical use.

Generally, the digital X-ray detector is generally designed to have several thousand or tens of thousands of pixels or many more pixels according to the size or resolution thereof. Referring to FIG. 1, each cell of the array substrate 10 for the digital X-ray detector may include a thin film transistor 20 disposed over a base substrate 11, a PIN diode 30 connected to the thin film transistor 20, and a scintillator 50 disposed over the array substrate 10.

When X-rays are emitted to the digital X-ray detector 1, the scintillator 50 converts the incident X-rays into visible light, such that the visible light is transmitted to the PIN diode 30 that includes a lower electrode 31, a PIN layer 33, and an upper electrode 35.

The visible light applied to the PIN diode 30 is re-converted into an electronic signal in the PIN layer 33. The electronic signal is converted into an image signal after passing through the thin film transistor 20 connected to the lower electrode 31 of the PIN diode 30, such that the resultant image signal is displayed on a display.

Meanwhile, in order to drive the PIN diode 30, a bias electrode 40 for applying a voltage to the PIN diode 30 may be connected to the PIN diode 30, and the bias electrode 40 may be disposed over the PIN diode 30 such that the bias electrode 40 is connected to the upper electrode 35 of the PIN diode 30.

However, the array substrate for the conventional digital X-ray detector has the following disadvantages.

First, a large step difference of the PIN diode 30 may deteriorate stack coverage characteristics, resulting in formation of a crack in a protective layer.

Referring to FIG. 1, an array substrate for a conventional digital X-ray detector may form a first protective layer 28 over a thin film transistor 20, and may form a PIN diode 30 over the first protective layer 28. A second protective layer 37 may be formed over the PIN diode 30, a bias electrode 40 formed over the second protective layer 37 may be connected to the PIN diode 30, and a third protective layer 43 may be formed over the bias electrode 40.

In this case, the second protective layer 37 and the third protective layer 43 may be formed to cover the PIN diode 30. A large step difference ($t_1$) corresponding to a thickness of the PIN diode 30 may occur between each of the protective layers of the region formed over the PIN diode 30 and each of the protective layers of the other region in which the PIN diode 30 is not formed.

Such large step difference of the PIN diode deteriorates stack coverage characteristics and causes a step difference between the protective layers, such that a crack of the protective layer occurs in the region A of FIG. 1, resulting in characteristic deterioration such as increased off-current.

A large step difference between the protective layers may affect deposition of a scintillator 50 disposed at an upper part of the digital X-ray detector, and may also increase X-ray scattering, resulting in reduction of modulation transfer function (MTF) characteristics.

In addition, the lower electrode 31 of the PIN diode 30 is connected to a source electrode 22 of the thin film transistor 20 through a second contact hole 27 of the first protective layer 28. In this case, the lower electrode 31 may contact the source electrode 22 through a contact hole, such that the lower electrode 31 is formed to have a bent part (or a curved part) therein.

In this way, if the PIN layer 33 is deposited over the lower electrode 31 having a bent part as shown in the region (B) of FIG. 1, a lower region of the PIN diode 30 may also be bent or curved, such that characteristic deterioration such as increased off-current of the PIN diode may occur.

In this case, if the PIN diode 30 is formed only in the remaining regions other than the bent part of the lower electrode 31 so as to address the characteristic deterioration problem, a fill factor (i.e., aperture ratio) of the PIN diode is reduced. In other words, the contact hole 27 (shown in the region B) of the first protective layer and a contact hole 25 (shown in the region C) of an interlayer insulation layer are excluded, and the PIN diode is formed in the remaining regions other than the regions B and C, such that the fill factor of the PIN diode can be reduced by as much as the reduced region of the PIN diode.

SUMMARY

Accordingly, embodiments of the present disclosure are directed to an array substrate for a digital X-ray detector, a digital X-ray detector including the same, and a method for manufacturing the same that substantially obviate one or more of the problems due to limitations and disadvantages of the related art.

An aspect of the present disclosure is to provide an array substrate for a digital X-ray detector to improve stack coverage by reducing a step difference of a PIN diode, a digital X-ray detector including the same, and a method for manufacturing the same.

Another aspect of the present disclosure is to provide an array substrate for a digital X-ray detector to minimize characteristic deterioration caused by a step difference of a PIN diode during formation of a scintillator, a digital X-ray detector including the same, and a method for manufacturing the same.

Another aspect of the present disclosure is to provide an array substrate for a digital X-ray detector to reduce characteristic deterioration such as increased off-current of a PIN diode by removing a bent part of a lower region of the PIN diode, a digital X-ray detector including the same, and a method for manufacturing the same.

Another aspect of the present disclosure is to provide an array substrate for a digital X-ray detector to increase a fill factor by increasing the size of a region of forming a PIN diode, a digital X-ray detector including the same, and a method for manufacturing the same.

Another aspect of the present disclosure is to provide an array substrate for a digital X-ray detector to increase fabrication efficiency by reducing the number of masks needed for overall fabrication, a digital X-ray detector including the same, and a method for manufacturing the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an array substrate for a digital X-ray detector comprises a base substrate, an active layer formed over the base substrate, configured to include a channel region, a source region and a drain region, wherein the source region and the drain region are respectively formed at one side and the other side based on the channel region, a gate insulation layer formed over the active layer corresponding to the channel region, a gate electrode disposed over the gate insulation layer, an interlayer insulation layer formed over the gate electrode and a drain region, configured to include a contact hole corresponding to the drain region, a drain electrode disposed over the interlayer insulation layer, and connected to the active layer through the contact hole, and a PIN diode in which a lower electrode, a PIN layer, and an upper electrode are stacked, configured to be in surface contact with the source region of the active layer.

The source region of the active layer may be in surface contact with an entire region of the lower electrode. The lower electrode may be disposed over the source region of the active layer. As a result, a step difference of the PIN diode is reduced, resulting in minimum characteristic deterioration of the PIN diode.

The source region of the active layer may be in surface contact with some regions of the lower electrode. The remaining region of the lower electrode, that is not in surface contact with the source region of the active layer, may be disposed over the same layer as the active layer. As a result, a step difference of the PIN diode is reduced, resulting in minimum characteristic deterioration of the PIN diode.

The lower electrode corresponding to the PIN layer may be planarized, such that a bent part of the lower region of the PIN diode is removed, resulting in minimum characteristic deterioration of the PIN diode.

The source region of the active layer may be larger in size than the drain region. If the PIN diode is formed over the source region, the formation region of the PIN diode is maximized in size, resulting in an increased fill factor.

In another aspect, a method for manufacturing the array substrate for the X-ray detector may comprise the following steps (i) to (v). In the first step (i), the method for manufacturing the array substrate includes forming a channel region over a base substrate, forming an active layer having a source region and a drain region respectively formed at one side and the other side based on the channel region, and forming an insulation layer and a gate electrode over the active layer corresponding to the channel region. In the second step (ii), the method for manufacturing the array substrate further includes forming an interlayer insulation layer that covers the gate electrode and the drain region and has a first contact hole corresponding to the drain region. In the third step (iii), the method for manufacturing the array substrate further includes forming the drain electrode being connected to the drain region through a first contact hole over the interlayer insulation layer, and forming a lower electrode over the source region to be in surface contact with the active layer. In the fourth step (iv), the method for manufacturing the array substrate further includes forming a PIN diode 240 having both a PIN layer and an upper electrode over the lower electrode. In the fifth step (v), the method for manufacturing the array substrate further includes forming a protective layer having a second contact hole over the PIN diode, and forming a bias electrode being connected to the upper electrode 245 through a second contact hole over the protective layer.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated and constitute a part of this application, illustrate embodiments of the disclosure and together with the description serve to explain various principles.

DETAILED DESCRIPTION

Figure 1:
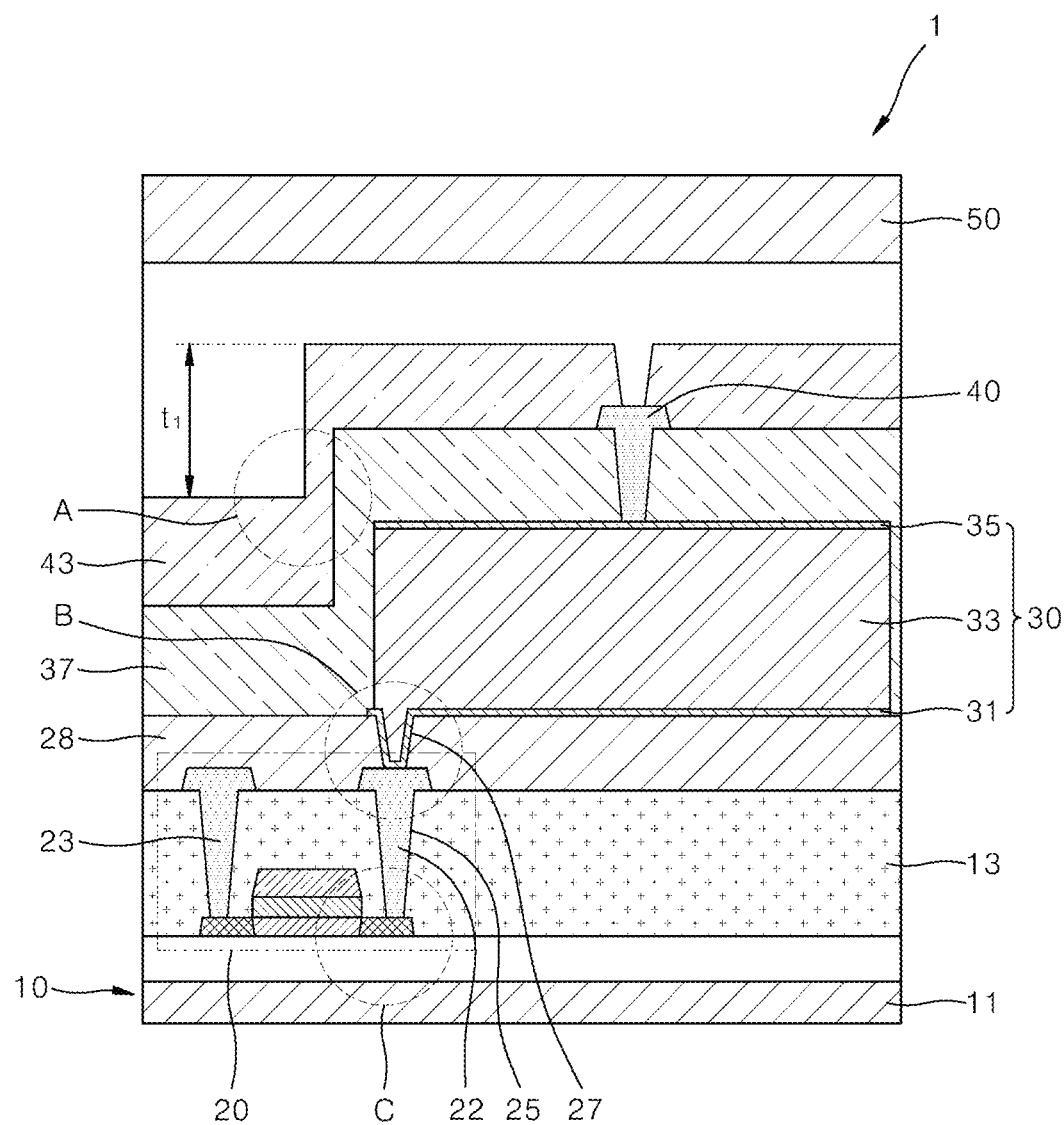
FIG. 1 is a cross-sectional view illustrating an array substrate corresponding to a single pixel region for use in a conventional digital X-ray detector.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

The embodiments of the present disclosure will hereinafter be described with reference to the attached drawings.

In the following description, assuming that a certain object is formed above (over) or below (beneath) the respective constituent elements, this means that two constituent elements are brought into direct contact with each other, or one or more constituent elements are disposed and formed between two constituent elements. In addition, assuming that a certain object is formed over or below the respective constituent elements, this means that the object may also be arranged in upward or downward directions on the basis of the position of one constituent element.

It will be understood that when one element is referred to as being "connected to", "coupled to", or "accessed by" another element, one element may be "connected to", "coupled to", or "accessed by" another element via a further element although one element may be directly connected to or directly accessed by another element.

Figure 2:
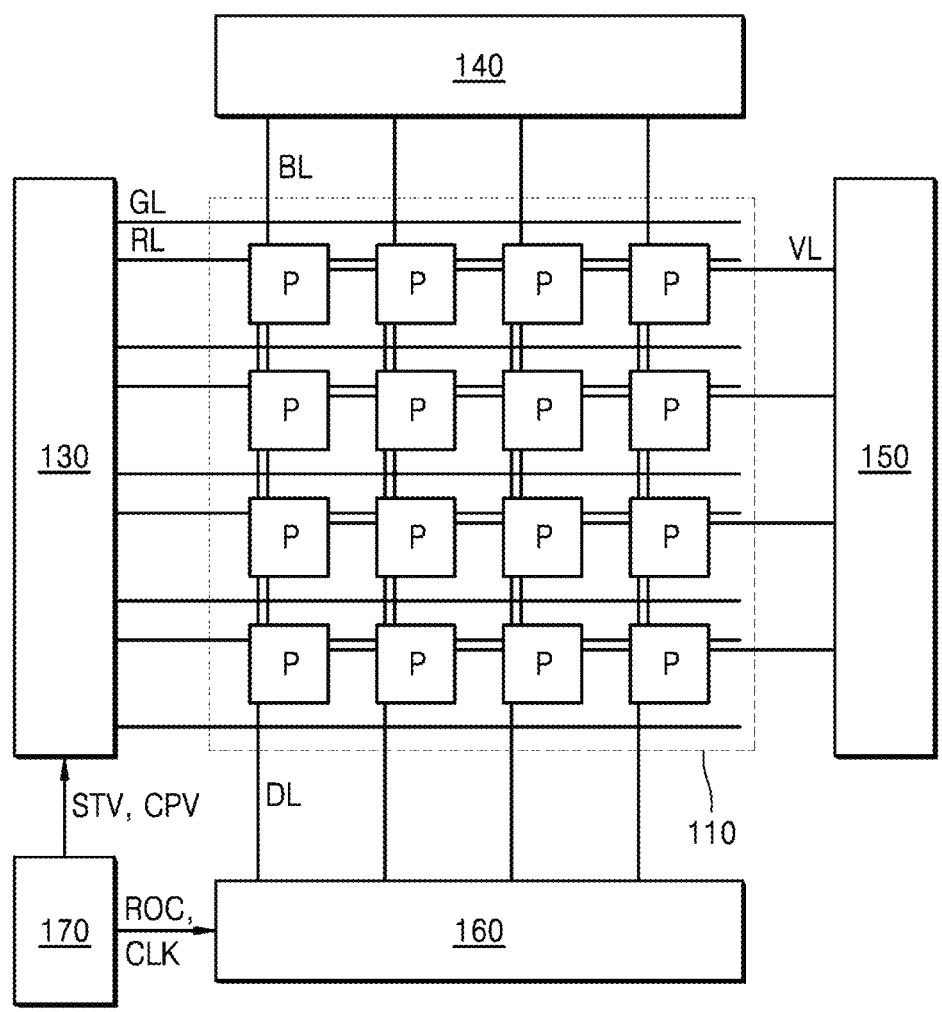
FIG. 2 is a schematic block diagram illustrating a digital X-ray detector according to an embodiment of the present disclosure.

FIG. 2 is a schematic plan view illustrating a digital X-ray detector. Referring to FIG. 2, the digital X-ray detector may include a thin film transistor (TFT) array 110, a gate driver 130, a bias supplier 140, a power-supply voltage supplier 150, a readout circuit 160, and a timing controller 170.

The TFT array 110 may sense X-rays emitted from an energy source, may perform photoelectric conversion of the sensed signal, and may thus output an electrical detection signal. In the TFT array 110, each cell region may be defined not only by a plurality of gate lines (GL) arranged in a horizontal direction, but also by a plurality of data lines (DL) arranged in a vertical direction perpendicular to the horizontal direction. Each cell region of the TFT array 110 may include a plurality of photosensitive pixels (P) arranged in a matrix.

Each photosensitive pixel (P) may include a PIN diode configured to sense light converted from X-rays and output the sensed light as a signal, and a thin film transistor (TFT) configured to transmit a detection signal output from the PIN diode in response to a gate signal. One side of the PIN diode may be connected to the thin film transistor (TFT), and the other side thereof may be connected to a bias line (BL).

A gate electrode of the thin film transistor (TFT) may be connected to the gate line (GL) through which a scan signal is transmitted, a source electrode may be connected to the PIN diode, and a drain electrode may be connected to the data line (DL) through which the detection signal is transmitted. The bias line BL may be arranged parallel to the data line (DL).

The gate driver 130 may sequentially apply a plurality of gate signals, each of which has a gate-ON voltage level, through the gate lines (GL). The gate driver 130 may also apply a plurality of reset signals, each of which has a gate-ON voltage level, through a plurality of reset lines (RL). Here, the gate-ON voltage level may refer to a voltage level at which thin film transistors of the photosensitive pixels can be turned on. The thin film transistors of the photosensitive pixels may be turned on in response to a gate signal or a reset signal.

The gate driver 130 may be an integrated circuit (IC) such that the gate driver 130 may be populated on an external substrate connected to the TFT array 110 or may be formed over the TFT array 110 through a Gate In Panel (GIP) process.

The bias supplier 140 may apply a drive voltage through bias lines (BL). The bias supplier 140 may apply a predetermined voltage to the PIN diode. In this case, the bias supplier 140 may selectively apply a reverse bias or a forward bias to the PIN diode.

The power-supply voltage supplier 150 may supply a power-supply voltage to the photosensitive pixels through power-supply voltage lines (VL).

The readout circuit 160 may read out the detection signal generated from the thin film transistor (TFT) that is turned on in response to the gate signal. Accordingly, the detection signal generated from the PIN diode may be input to the readout circuit 160 through the data lines (DL).

The readout circuit 160 may include a signal detector, a multiplexer, etc. The signal detector may include a plurality of amplification circuits corresponding to the data lines (DL) on a one to one basis, and each amplification circuit may include an amplifier, a capacitor, a reset element, etc.

In order to control the gate driver 130, the timing controller 170 may generate a start signal (STV), a clock signal (CPV), etc., and may transmit the start signal (STV), the clock signal (CPV), etc. to the gate driver 130. In order to control the readout circuit 160, the timing controller 170 may generate a readout control signal (ROC), a readout clock signal (CLK), etc., and may transmit the readout control signal (ROC), the readout clock signal (CLK), etc. to the readout circuit 160.

Figure 3:
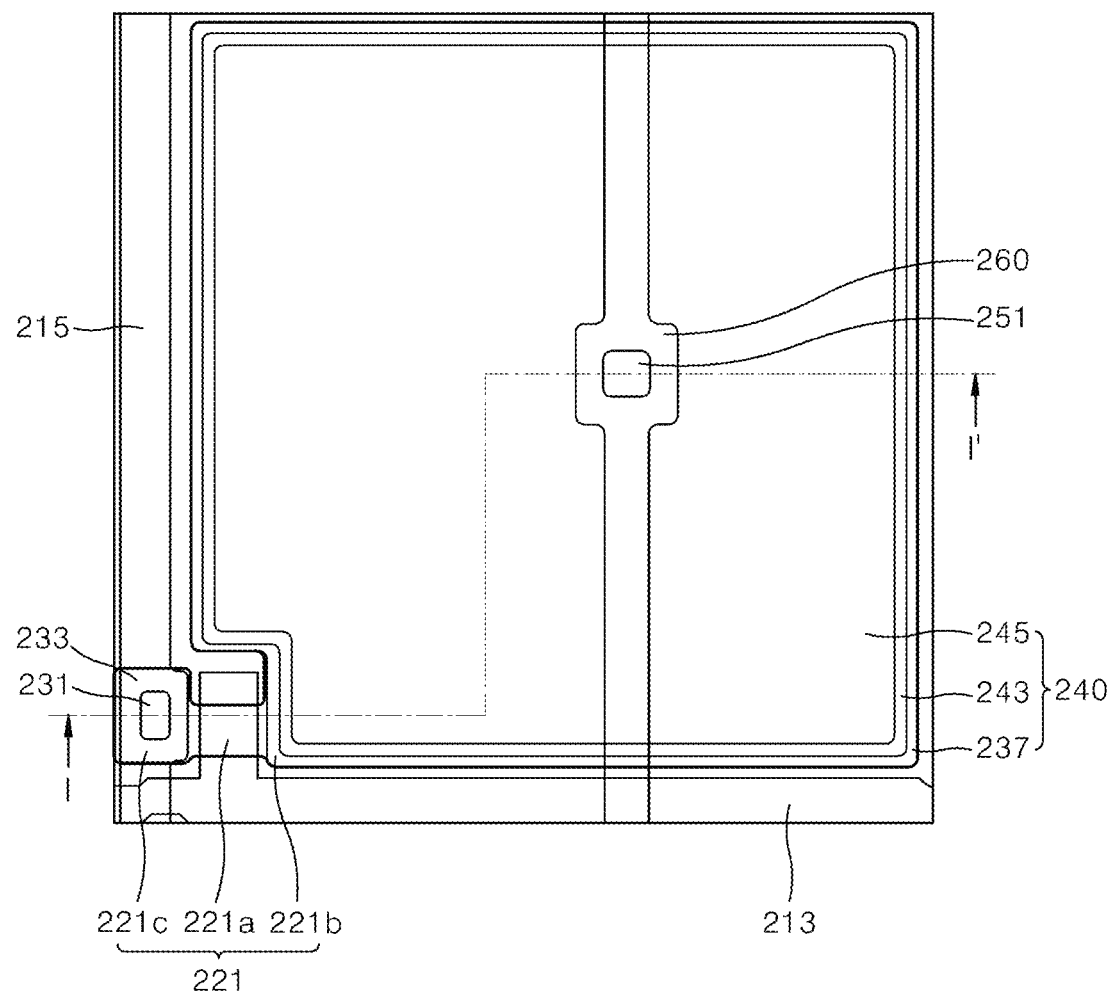
FIG. 3 is a cross-sectional view illustrating an array substrate corresponding to a single pixel region for use in a digital X-ray detector according to a first embodiment of the present disclosure.
Figure 4:
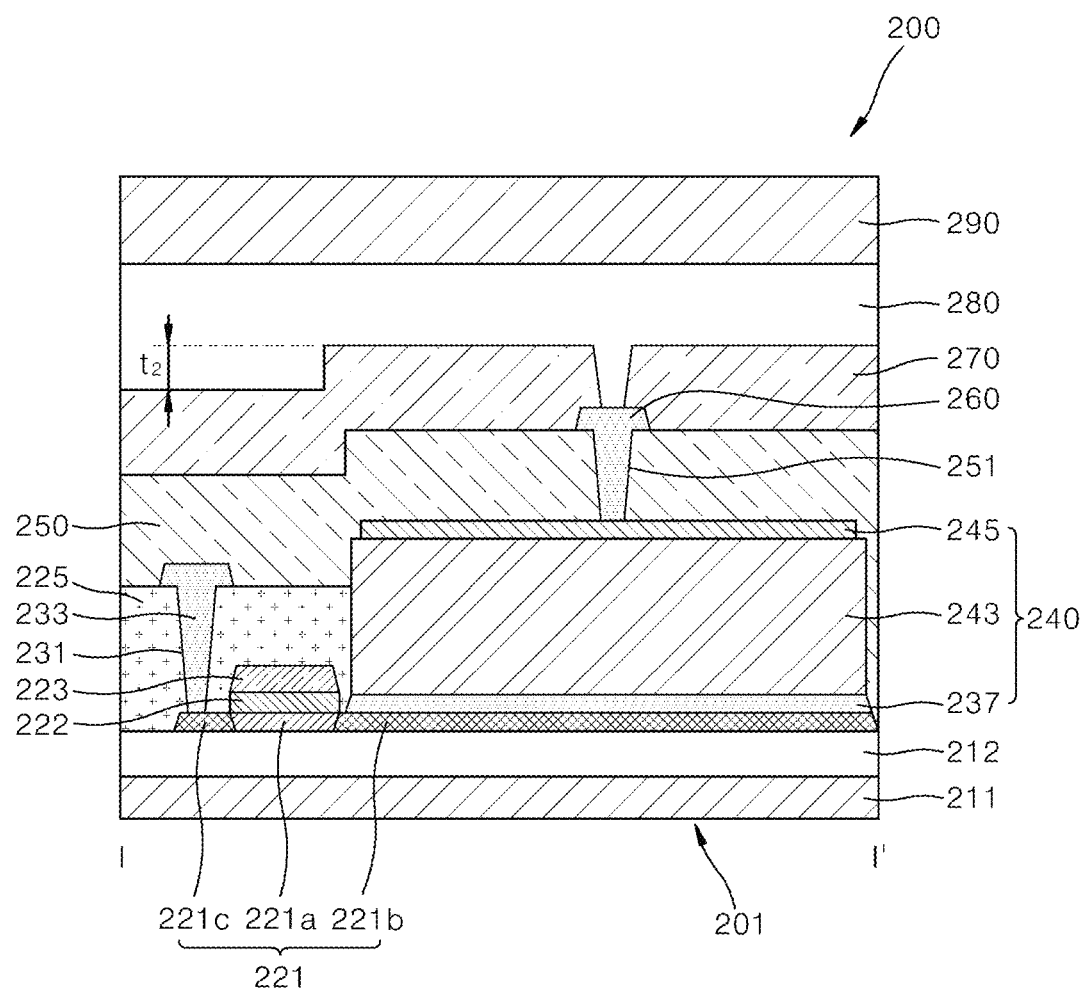
FIG. 4 is a cross-sectional view illustrating the array substrate taken along the line I-I' of FIG. 3 for use in the digital X-ray detector according to a first embodiment of the present disclosure.

FIG. 3 is a cross-sectional view illustrating an array substrate corresponding to a single pixel region for use in a digital X-ray detector according to a first embodiment of the present disclosure. FIG. 4 is a cross-sectional view illustrating the array substrate taken along the line I-I' of FIG. 3 for use in the digital X-ray detector according to a first embodiment of the present disclosure. The first embodiment of the present disclosure will hereinafter be described with reference to FIGS. 3 and 4.

Pixel regions may be defined by intersection regions of the gate lines 213 arranged in one direction and the data lines 215 arranged in the other direction perpendicular to the gate lines 213, and each of the pixel regions may include a thin film transistor and a PIN diode 240.

An active layer 221 may be disposed over the base substrate 211. In this case, a buffer layer 212 may be disposed between the base substrate 211 and the active layer 221. The buffer layer 212 may be a monolayer or multilayer structure formed of a silicon oxide (SiOx) film or a silicon nitride (SiNx) film.

Although the embodiment has exemplarily disclosed that the active layer 221 is formed of an oxide semiconductor material for convenience of description, the scope or spirit of the present disclosure is not limited thereto, and the active layer 221 may also be formed of a Low Temperature Polycrystalline Silicon (LTPS) or amorphous silicon (a-Si) without departing from the scope and spirit of the present disclosure. In this case, the oxide semiconductor material may be formed of an indium gallium zinc oxide (IGZO)-based material.

The active layer 221 may include a channel region 221a through which electrons move, and a source region 221b and a drain region 221c respectively formed at both ends of the channel region 221a. The source region 221b and the drain region 221c of the active layer 221 may be used as conductive regions. In this case, the source region 221b of the active layer 221 may be formed to have a larger region than the drain region 221c, and the entirety of the active layer 221 may be planarized.

A gate insulation layer 222 may be disposed over the active layer 221. The gate insulation layer 222 may perform insulation between the active layer 221 and the gate electrode 223, and may be formed of a monolayer or multilayer structure formed of a silicon oxide (SiOx) film or silicon nitride (SiNx) film. The gate insulation layer 222 may be disposed to correspond to the channel region 221a of the active layer 221.

The gate electrode 223 extending from a gate line 213 so as to correspond to the channel region 221a of the active layer 221 may be disposed over the gate insulation layer 222. The gate electrode 223 may be formed of a monolayer or multilayer structure formed of a conductive material.

An interlayer insulation layer 225 may be formed over the gate electrode 223. The interlayer insulation layer 225 may be formed of the same material as the gate insulation layer 222. The interlayer insulation layer 225 may be formed to cover the gate electrode 223 and the drain electrode 221c of the active layer 221, and may expose the source region 221b of the active layer 221. However, the interlayer insulation layer 225 formed in the vicinity of a boundary region between the channel region 221a and the source region 221b of the active layer 221 may also be formed to cover some parts of the source region 221b as necessary. A first contact hole 231 corresponding to the drain region 221c of the active layer 221 may be formed over the interlayer insulation layer 225.

The drain electrode 233 formed of a conductive material may be formed over the interlayer insulation layer 225, such that the drain electrode 233 may be electrically connected to the drain region 221c of the active layer 221 by contacting the drain region 221c of the active layer 221 through the first contact hole 231.

A PIN diode 240 in which a lower electrode 237, a PIN layer 243, and an upper electrode 245 are sequentially stacked may be disposed over the source region 221b of the active layer 221, and the source region 221b of the active layer 221 and the lower electrode 237 of the PIN diode 240 may be in surface contact with each other. That is, in the drain region 221c, the drain electrode 233 may contact the active layer 221 through a contact hole. In contrast, in the source region 221b, the active layer 221 may be in surface contact with the lower electrode 237 of the PIN diode 240, without contacting the lower electrode 237 of the PIN diode 240 through a contact hole.

The lower electrode 237 may be formed of a non-transparent metal such as molybdenum (Mo) or a transparent oxide material such as indium tin oxide (ITO), indium zinc oxide (IZO), or zinc oxide (ZnO) according to characteristics of the PIN diode 240.

In more detail, the lower electrode 237 of the PIN diode 240 may be disposed over the source region 221b of the active layer 221, such that the entire region of the lower electrode 237 may be in surface contact with the source region 221b of the active layer 221. Therefore, it is necessary for the source region 221b of the active layer 221 to have a sufficient-sized region corresponding to the region of the PIN diode 240, and the source region 221b of the active layer 221 may be larger in length and width than the drain region 221c. Preferably, as shown in FIG. 3, the planar region of the source region 221b of the active layer 221 may be equal to or larger than the planar region of the PIN diode 240.

The lower electrode 237 corresponding to the PIN layer 243 of the PIN diode 240 may be formed over the planarized active layer 221, such that the entirety of a lower region of the PIN diode 240 may be planarized without having a curved region therein.

The lower electrode 237 of the PIN diode 240 may serve as a source electrode connected to the source region 221b of the active layer 221, such that the source electrode and the lower electrode 237 of the PIN diode 240 may be formed as a single electrode. Therefore, the active layer 221, the gate electrode 223, the drain electrode 233, and the lower electrode 237 (serving as a source electrode) of the PIN diode 240 may serve as a single thin film transistor.

As described above, assuming that the lower electrode of the PIN diode is in surface contact with the source region of the planarized active region, the following effects can be obtained.

The lower electrode 237 of the PIN diode 240 is in surface contact with the source region 221b of the planarized active layer 221 without being connected to the source region 221b through a contact hole, such that the lower electrode 2237 may also be planarized. Therefore, characteristic deterioration in which an off-current of the PIN diode increases due to the bent part of the lower region of the PIN diode 240 can be minimized.

According to the related art, since characteristics of the PIN diode are deteriorated when the source electrode contacts the active layer through a contact hole within the source region, the PIN diode is not formed in a curved contact hole region, such that the fill factor is reduced by the size of the region having no PIN diode.

In contrast, according to the present disclosure, the active layer 221 is in surface contact with the lower electrode 237 of the PIN diode 240 corresponding to the source electrode, such that characteristic deterioration does not occur although the PIN diode 240 is formed in a conventional contact hole region. Therefore, the present disclosure can increase the size of the region in which the PIN diode 240 is formed, such that overall fill factor is increased.

The PIN layer 243 in which an N-type (negative) semiconductor layer having N-type impurities, an intrinsic (I-type) semiconductor layer having no impurities, and a P-type (positive) semiconductor layer including P-type impurities are sequentially stacked, may be disposed over the lower electrode 237.

The intrinsic (I-type) semiconductor layer may be formed to have a greater thickness as compared to the N-type semiconductor layer and the P-type semiconductor. The PIN layer 243 may include a material capable of converting X-rays emitted from an energy source into an electric signal. For example, the PIN layer 243 may include amorphous selenium (a-Se), mercuric iodide (HgI2), cadmium telluride (CdTe), lead oxide (PbO), lead iodide (PbI2), bismuth triiodide (BiI3), gallium arsenide (GaAs), germanium (Ge), and the like.

An upper electrode 245 may be disposed over the PIN layer 243 such that the PIN diode 240 is constructed together with the lower electrode 237 and the PIN layer 243. The upper electrode 245 may be formed of a transparent conductive material such as indium tin oxide (ITO), indium zinc oxide (IZO), or zinc oxide (ZnO) so as to increase light transmission efficiency of the scintillator 290 that receives X-rays and performs conversion of a wavelength of the X-rays.

A first protective layer 250 formed to cover the PIN diode 240 and the drain electrode 233 may be formed over the PIN diode 240. The first protective layer 250 may be formed across the entire surface of the base substrate 211, and may be a monolayer or multilayer structure formed of a silicon oxide (SiOx) film or a silicon nitride (SiNx) film.

A second contact hole 251 may be formed over the first protective layer 250 of the PIN diode 240. A bias electrode 260 may be formed over the first protective layer 250, such that the bias electrode 260 may be connected to the upper electrode 245 of the PIN diode 240 through the second contact hole 251.

In this case, the bias electrode 260 may be disposed not to overlap the channel region 221a of the active layer 221. The thin film transistor according to the present disclosure has a top-gate coplanar structure, such that the gate electrode 223 may protect the channel region 221a of the active layer 221.

Specifically, the array substrate 201 for the digital X-ray detector according to the present disclosure is exposed to X-rays, such that a protective layer capable of preventing the channel region 221a from being exposed to X-rays is needed.

That is, the gate electrode 223 serves as the protective layer that prevents the channel region 221a of the active layer 221 from being exposed to X-rays, such that the bias electrode 260 need not additionally cover the channel region 221a of the active layer 221. Accordingly, the bias electrode 260 must occupy some regions of the PIN diode 240, such that the fill factor of the PIN diode 240 can be improved.

In contrast, for example, according to a BCE structure of a bottom gate in which the gate electrode is disposed below the active layer, a channel region of the active layer is exposed to X-rays, such that an additional protective layer capable of protecting the channel region is needed.

In this case, the bias electrode connected to the PIN diode is used as a protective layer, such that the bias electrode extends from the PIN diode to the channel region of the active layer, such that the resultant bias electrode is formed to cover an upper part of the channel region. Therefore, the upper region of the PIN diode formed to overlap the bias electrode is increased in size, resulting in reduction of the fill factor of the PIN diode.

A second protective layer 270 is formed over the bias electrode 260. The second protective layer 270 may be formed across the entire surface of the base substrate 211 so as to cover the first protective layer 250. In this case, as shown in FIG. 4, it can be confirmed that the step difference ($t_2$) of the second protective layer 270 for use in the array substrate 201 has a much smaller width than in the related art.

That is, the thin film transistor and the PIN diode 240 according to the present disclosure are formed in the same region, such that a step difference of the PIN diode 240 is reduced and a step difference of the second protective layer 270 can also be reduced as shown in FIG. 4. Stack coverage is improved due to reduction of the step difference, such that the number of cracks in the second protective layer 270 is minimized and off-current of the PIN diode 240 is reduced, resulting in minimum characteristic deterioration of the PIN diode 240.

Step difference reduction of the second protective layer 270 according to reduction of the step difference of the PIN diode 240 may allow the scintillator 290 to be immediately formed without forming an additional planarization layer 280, when the scintillator 290 is formed over the second protective layer 270.

That is, step difference reduction of the PIN diode 240 may guarantee characteristics of the scintillator 290 without using a separate planarization process prior to formation of the scintillator 290. In addition, X-ray scattering caused by a large step difference according to the related art is reduced, such that MTF (Modulation Transfer Function) characteristics can be improved.

However, the planarization layer 280 may also be additionally formed between the second protective layer 270 and the scintillator 290 as necessary.

Figure 5:
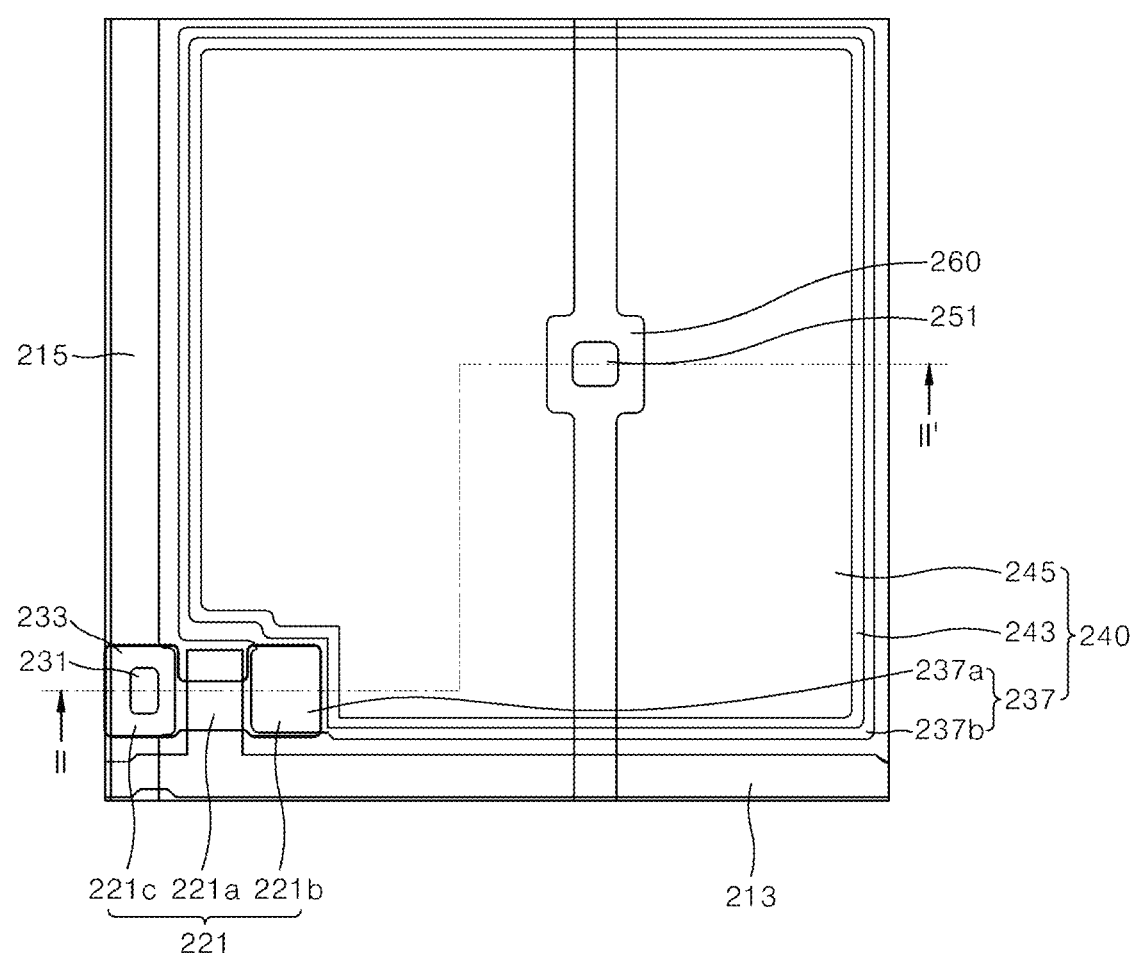
FIG. 5 is a cross-sectional view illustrating an array substrate corresponding to a single pixel region for use in a digital X-ray detector according to a second embodiment of the present disclosure.
Figure 6:
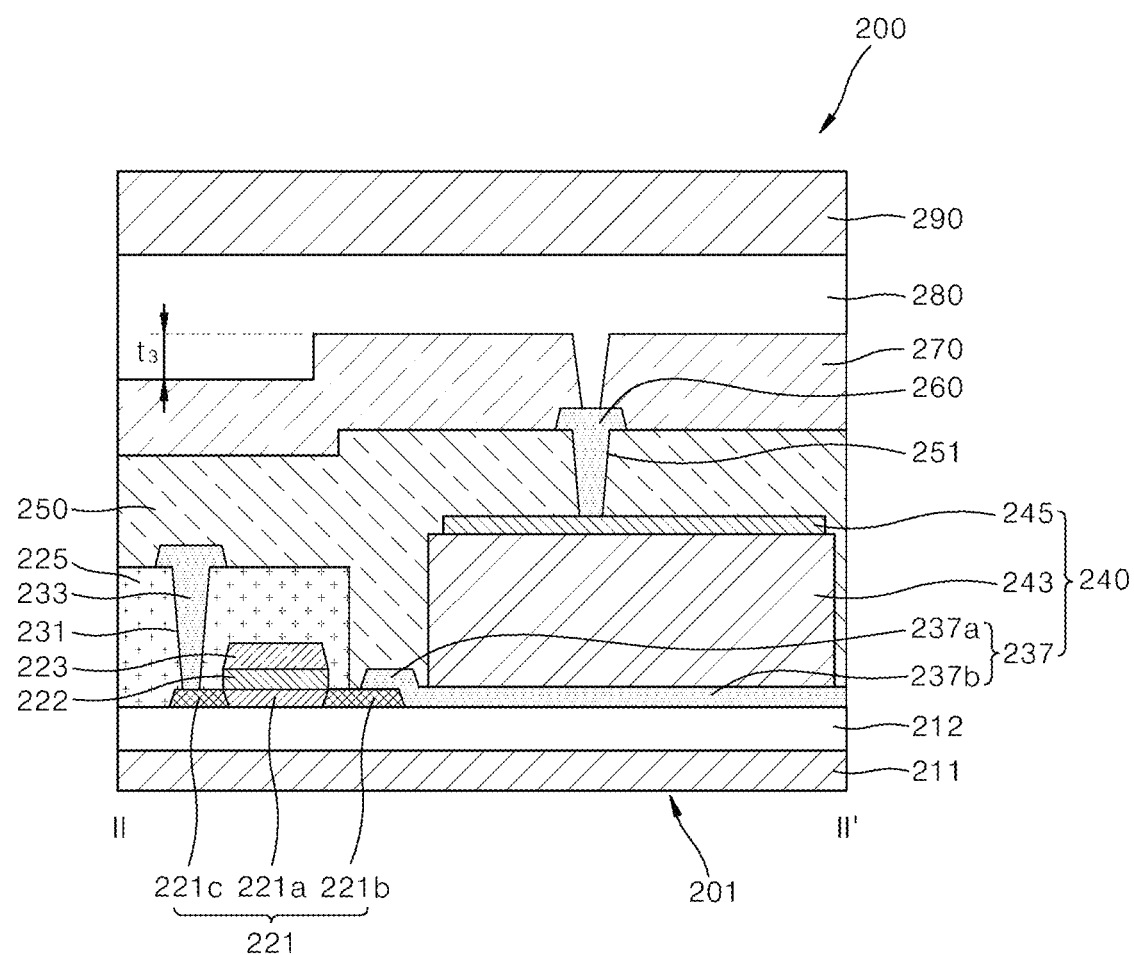
FIG. 6 is a cross-sectional view illustrating the array substrate taken along the line II-II' of FIG. 5 for use in a digital X-ray detector according to a second embodiment of the present disclosure.

FIG. 5 is a cross-sectional view illustrating an array substrate corresponding to a single pixel region for use in a digital X-ray detector according to a second embodiment of the present disclosure. FIG. 6 is a cross-sectional view illustrating the array substrate taken along the line II-II' of FIG. 5 for use in a digital X-ray detector according to a second embodiment of the present disclosure.

The second embodiment will hereinafter be described centering upon characteristics different from those of the first embodiment. Among the omitted contents, contents of the second embodiment, that are commonly applied to the first embodiment, will hereinafter be applied to the second embodiment without change.

In an array substrate 201 according to the second embodiment, an active layer 221 may be formed over a base substrate 211, and the active layer 221 may include a channel region 221a, a source region 221b, and a drain region 221c. The source region 221b and the drain region 221c may be respectively formed at one side and the other side on the basis of the channel region 221a.

The source region 221b of the active layer 221 may be in surface contact with some regions of a lower electrode 237 of a PIN diode 240. In more detail, whereas the drain region 221c of the active layer 221 contacts a drain electrode 233 through a contact hole, the source region 221b is in surface contact with the lower electrode 237 of the PIN diode 240 and is in surface contact with some regions of the lower electrode 237.

Therefore, whereas the region 237a of the lower electrode 237 that is in surface contact with the source region 221b of the active layer 221 is formed over the source region 221b, the remaining region 237b other than the region 237a, that is not in surface contact with the source region 221b, may be disposed at the same layer as the active layer 221.

In this case, a PIN layer 243 of the PIN diode 240 and an upper electrode 245 may be formed over the remaining region 237b other than the region 237a that is in surface contact with the source region 221b of the active layer 221.

That is, the lower electrode region 237a being in surface contact with the source region 221b of the active layer 221 is excluded from the lower electrode 237, the PIN layer 243 and the upper electrode 245 may be formed over the planarized lower electrode region 237b disposed over the base substrate 211 corresponding to the same layer as the active layer 221, such that a bent part of the lower region of the PIN diode 240 can be removed.

In addition, even in the case of using the second embodiment, the PIN diode 240 is formed in the same region as the thin film transistor, such that a step difference of the PIN diode 240 can be greatly reduced. As a result, a step difference ($t_3$) of the second protective layer 270 can be further reduced as shown in FIG. 6.

Therefore, even in the case of using the second embodiment, characteristic deterioration such as off-current reduction of the PIN diode affected by the bent part of the lower region of the PIN diode 240 can be minimized, such that the number of cracks generated in the second protective layer 270 can be minimized by improvement in stack coverage. Characteristics of the scintillator 290 can be guaranteed without executing a separate planarization process prior to formation of the scintillator 290. X-ray scattering caused by a large step difference encountered in the related art can also be reduced, such that MTF characteristics can also be improved.

Since the source region 221b of the active layer 221 is in surface contact with another layer, the source region 221b may be formed to have a smaller region than the drain region 221c that contacts another layer through a contact hole. As a result, the PIN diode 240 may be formed to have a larger region as large as the reduced region of the source region 221b, resulting in improvement in the fill factor of the PIN diode.

The above-mentioned X-ray detector 200 may operate as follows.

X-rays emitted to the X-ray detector 200 may be converted into visible light by the scintillator 290. The visible light may be converted into an electronic signal by the PIN layer 243 of the PIN diode 240.

In more detail, when visible light is emitted to the PIN layer 243, the intrinsic semiconductor layer is depleted by the P-type semiconductor layer and the N-type semiconductor layer, and thus generates an electric field therein. Electrons and holes generated by light may be drifted by the electric field, and are then collected in the P-type semiconductor layer and in the N-type semiconductor layer, respectively.

The PIN diode 240 may convert visible light into an electronic signal, and may deliver the electronic signal to the thin film transistor. The delivered electronic signal may be displayed as an image signal after passing through the data line 215 connected to the thin film transistor.

A method for manufacturing the array substrate for the X-ray detector according to an embodiment of the present disclosure includes the following steps (i) to (v).

In the first step (i), a method for manufacturing the array substrate includes forming a channel region 221a over a base substrate 211a, forming an active layer 221 having a source region 221b and a drain region 221c respectively formed at one side and the other side on the basis of the channel region 221a, and forming an insulation layer 222 and a gate electrode 223 over the active layer 221 corresponding to the channel region 221a.

In the second step (ii), a method for manufacturing the array substrate further includes forming an interlayer insulation layer 225 that covers the gate electrode 223 and the drain region 221c and has a first contact hole 231 corresponding to the drain region 221c.

In the third step (iii), a method for manufacturing the array substrate further includes forming the drain electrode 233 being connected to the drain region 221c through a first contact hole 231 over the interlayer insulation layer 225, and forming a lower electrode 237 over the source region 221b to be in surface contact with the active layer 221.

In the fourth step (iv), a method for manufacturing the array substrate further includes forming a PIN diode 240 having both a PIN layer and an upper electrode 245 over the lower electrode 237.

In the fifth step (v), a method for manufacturing the array substrate further includes forming a protective layer having a second contact hole 251 over the PIN diode 240, and forming a bias electrode 260 being connected to the upper electrode 245 through a second contact hole 251 over the protective layer.

As to a method for manufacturing the array substrate for the X-ray detector according to the embodiments of the present disclosure, a fabrication method of the first embodiment shown in FIG. 7 will first be described, and thereafter the description will center upon different characteristics between the first embodiment of FIG. 7 and the second embodiment of FIG. 8.

The following method for forming patterns over respective layers will be implemented using a photolithography process well known to those skilled in the art. Here, the photolithography process may include deposition, photoresist (PR) coating, exposure, development, etching, and photoresist (PR) stripping, and a detailed description thereof will herein be omitted for convenience of description. For example, if a metal material is used in the deposition process, sputtering of the metal material may be used. If a semiconductor or an insulation layer is used, a Plasma Enhanced Chemical Vapor Deposition (PECVD) method may be used. Even in the case of the etching process, dry etching or wet etching may be selectively used according to material types, and any of technologies well known to those skilled in the art can be properly used as necessary.

A buffer layer 212 may be formed over the base substrate 211. The buffer layer 212 may be selectively formed. The buffer layer 212 may not be formed as necessary. The active layer 221 may be formed over the buffer layer 212 using a first mask process (see FIG. 7A).

In this case, the active layer 221 may be formed to have a large region such that the active layer 221 can cover not only the region in which the thin film transistor will be formed, but also the other region in which the PIN diode 240 will be formed. The active layer of the region in which the PIN diode 240 will be formed may be formed to have a specific shape and region corresponding to the shape and region of the PIN diode 240.

Subsequently, a gate insulation layer (not shown) and a gate electrode film (not shown) may be formed to cover the active layer 221 and the entire base substrate 211. A second mask process (see FIG. 7B) is performed at the gate insulation layer and the gate electrode film, such that the gate electrode 223 and the gate insulation layer 222 may be patterned and formed to correspond to the channel region 221a of the active layer 221 in the region in which the thin film transistor will be formed.

The active layer 221 may be changed to a conductor such that the source region 221b and the drain region 221c may be respectively formed at one side and the other side of the channel region 221a of the active layer 221. For a process for changing the source region 221b and the drain region 221c of the active layer 221 to conductive materials according to the present disclosure, although the present disclosure may use a method for allowing the source region 221b and the drain region 221c to be exposed to an etchant during etching of the interlayer insulation layer in a manner that the source region 221b and the drain region 221c are changed to conductive materials, the scope or spirit of the present disclosure is not limited thereto.

The source region 221b of the active layer 221 may be formed in the region in which the PIN diode 240 will be formed, and the drain region 221c may be formed at the other side of the region in which the thin film transistor will be formed. In this case, the source region 221b of the active layer 221 may be formed to have a sufficient size and region in a manner that the PIN diode 240 can be formed at an upper part of the source region 221b, and the source region 221b may be formed to have a larger area than the drain region 221c.

Figure 7A:
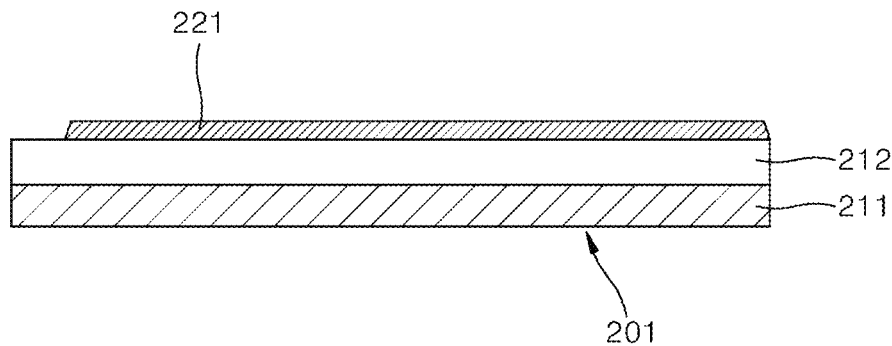
FIGS. 7A to 7I illustrate a method for manufacturing an array substrate for a digital X-ray detector according to a first embodiment of the present disclosure.
Figure 7B:
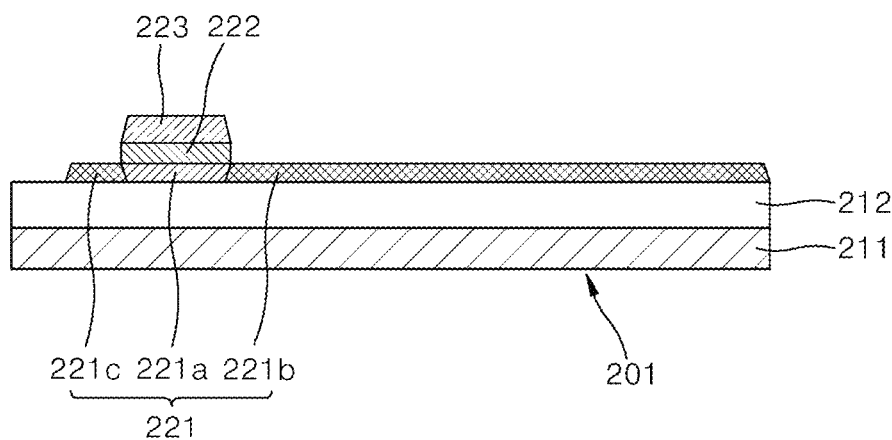
Figure 7C:
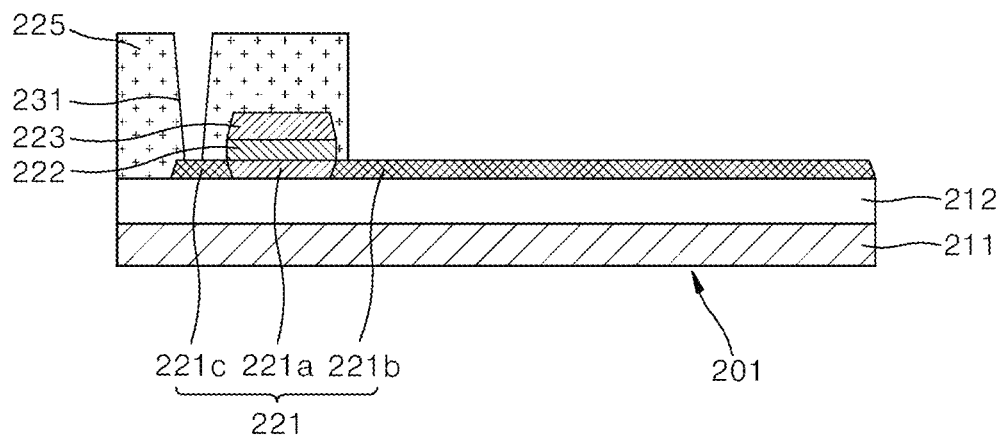
Figure 7D:
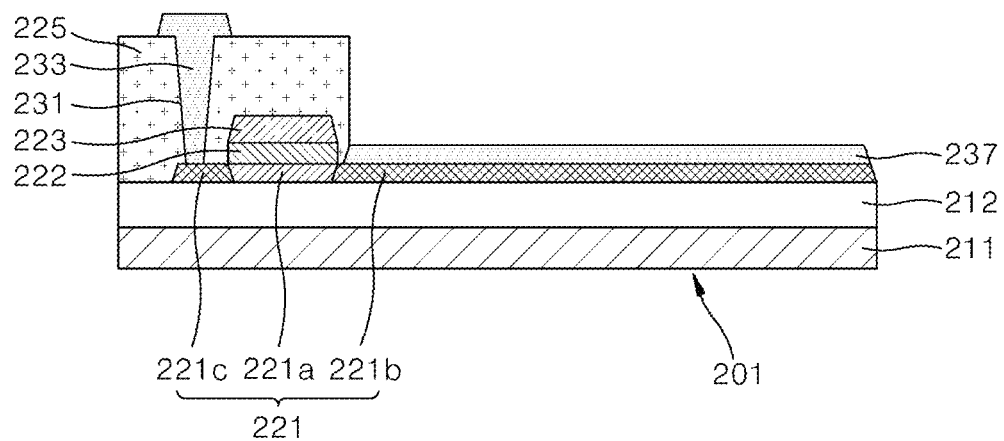
Figure 7E:
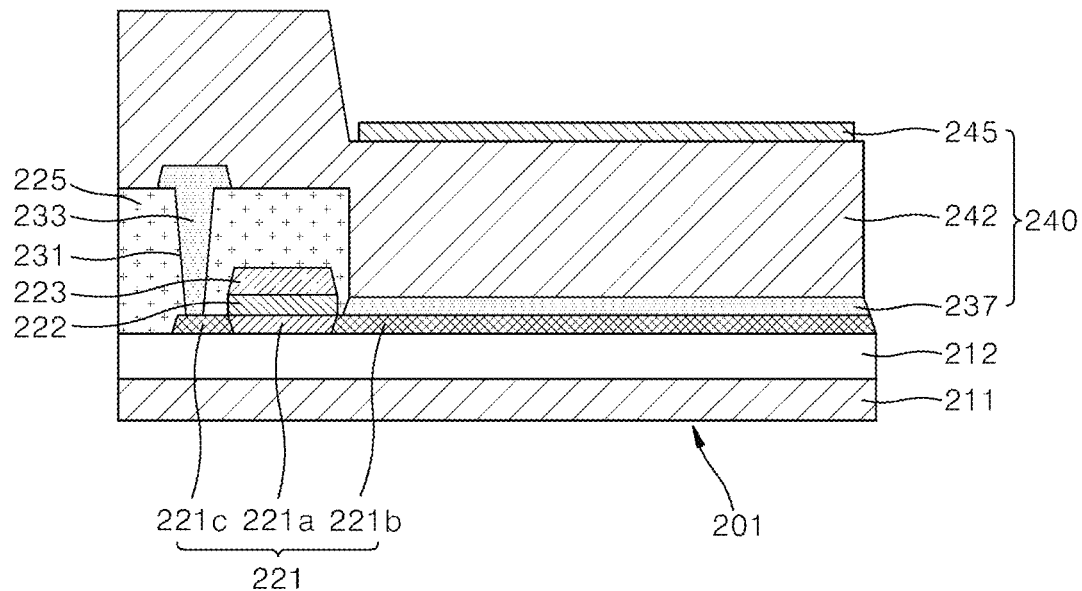
Figure 7F:
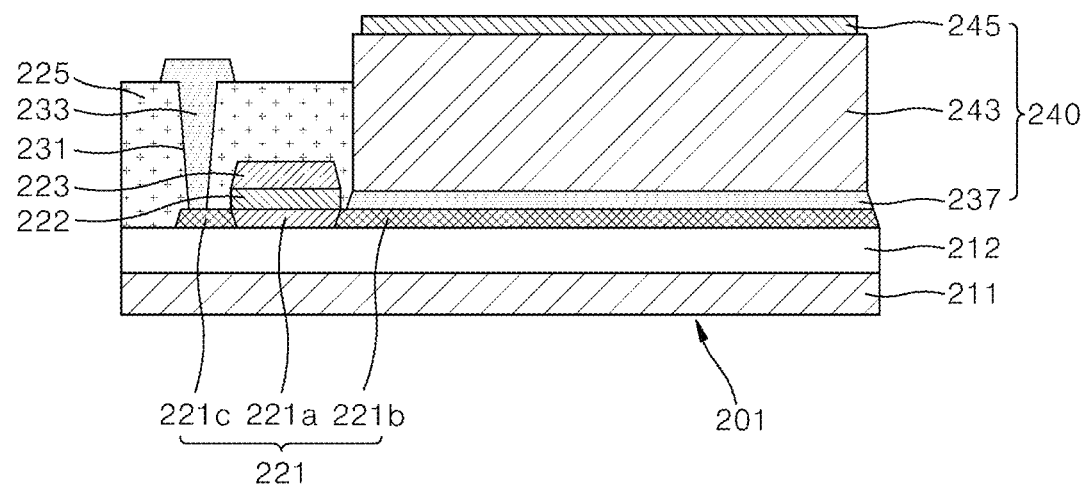

Subsequently, an interlayer insulation layer (not shown) may be formed to cover the base substrate 211 using a third mask process (see FIG. 7C). The interlayer insulation layer 225 may be formed to cover the gate electrode 223 and the drain region 221c of the active layer 221 in a manner that the source region 221b of the active layer 221 is exposed. In addition, the first contact hole 231 may be formed in the interlayer insulation layer 225 such that the interlayer insulation layer 225 can correspond to the drain region 221c of the active layer 221 during formation of the interlayer insulation layer 225.

Subsequently, the drain electrode 233 may be formed over the interlayer insulation layer 225 corresponding to the drain region 221c of the active layer 221 using a fourth mask process (see FIG. 7D), and the lower electrode 237 of the PIN diode 240 may be in surface contact with the source region 221b of the active layer 221. In this case, the drain electrode 233 and the lower electrode 237 may be simultaneously formed by the same patterning process, after formation of the same metal film.

In more detail, the drain electrode 233 may be connected to the drain region 221c of the active layer 221 through the first contact hole 231 included in the interlayer insulation layer 225.

The lower electrode 237 of the PIN diode 240 formed over the source region 221b may be used as a source electrode of the thin film transistor. The source electrode of the thin film transistor and the lower electrode 237 of the PIN diode 240 according to the present disclosure need not be formed as different electrodes, resulting in implementation of a simplified structure.

The entire region of the lower electrode 237 of the PIN diode 240 may be in surface contact with the source region 221b of the active layer 221, and the source region 221b may be implemented as a planarized layer, such that the lower electrode 237 of the PIN diode 240 may also be formed as a planarized layer and the lower region of the PIN diode 240 may be formed without being curved.

Subsequently, a PIN film 242 may be formed to cover the entire region of the base substrate 211 using a fifth mask process (see FIG. 7E), and an upper electrode 245 may be formed over the PIN film 242 corresponding to the lower electrode 237 of the PIN diode 240. The PIN film 242 may be patterned to form the PIN layer 243 using a sixth mask process (see FIG. 7F), and the PIN diode 240 including the lower electrode 237, the PIN layer 243 and the upper electrode 245 may be formed.

Figure 7G:
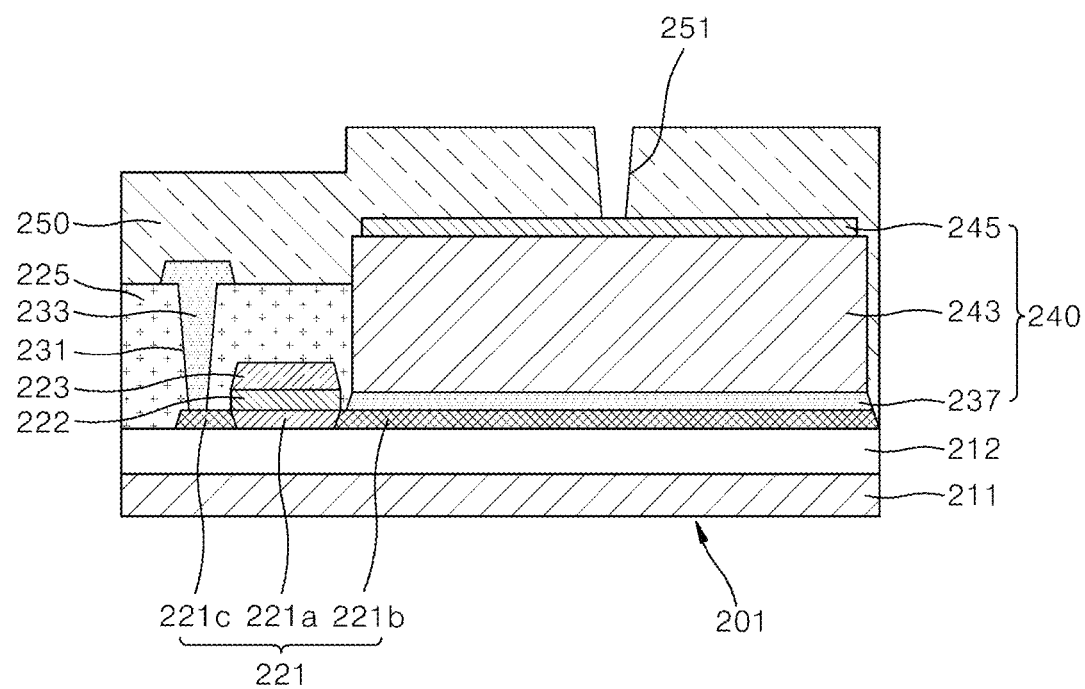
Figure 7H:
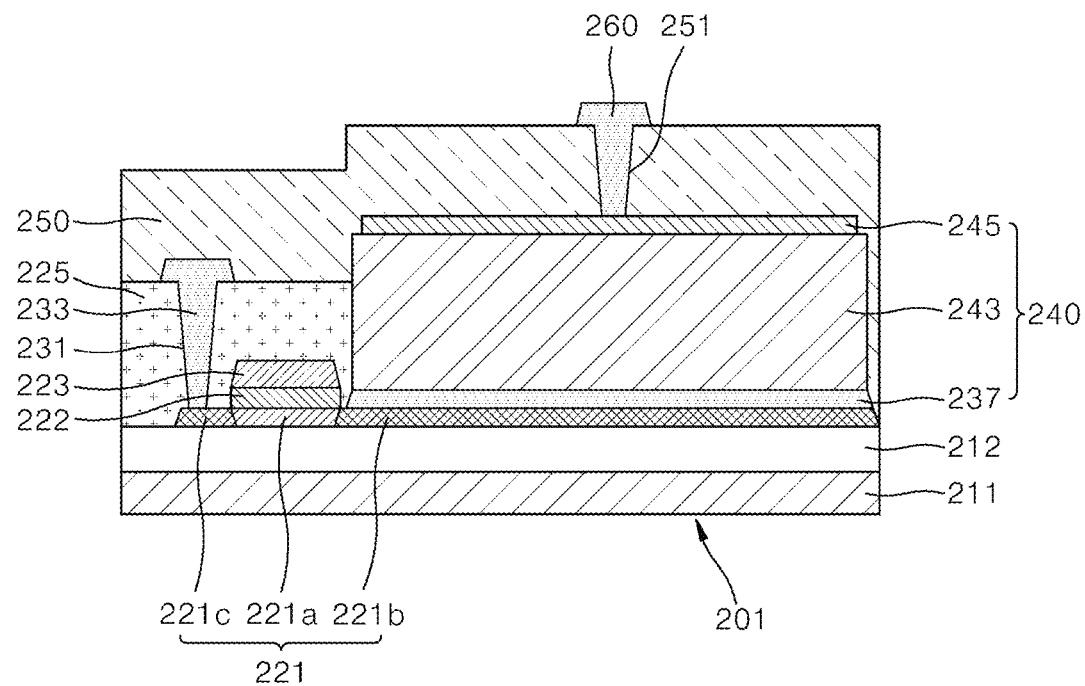
Figure 7I:
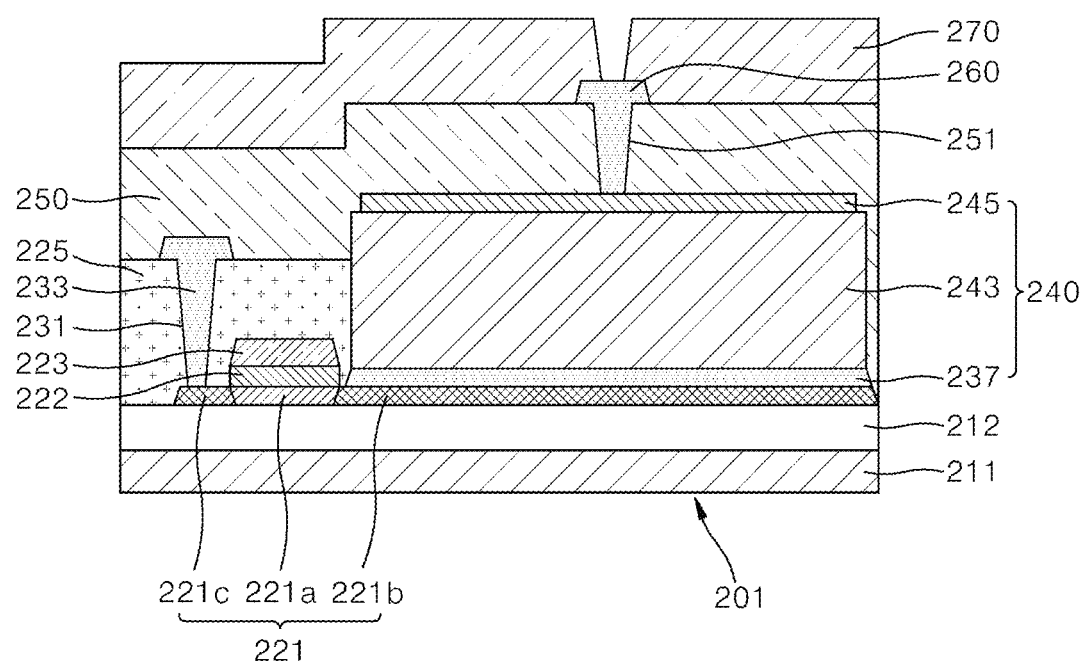

Thereafter, a first protective layer 250 having a second contact hole 251 may be formed over the upper electrode 245 of the PIN diode 240 using a seventh mask process (see FIG. 7G). A bias electrode 260 connected to the upper electrode 245 of the PIN diode 240 through the second contact hole 251 of the first protective layer 250 may be formed using an eighth mask process (see FIG. 7H). A second protective layer 270 may be formed to cover the first protective layer 250 having the bias electrode using a ninth mask process (see FIG. 7i).

As described above, the method for manufacturing the array substrate according to the first embodiment can be carried out using a total of 9 mask processes up to the process for forming the protective layer covering the bias electrode, such that the total number of masks needed for overall fabrication is reduced, resulting in improved fabrication efficiency.

In this way, the total number of masks needed for fabrication process is reduced, such that production costs needed for overall fabrication are reduced and simplified fabrication is implemented, resulting in maximum fabrication efficiency.

FIGS. 8A to 8I illustrate a method for manufacturing an array substrate for a digital X-ray detector according to a second embodiment of the present disclosure. In the following description, the same contents as in the first embodiment will herein be omitted for convenience of description, and the second embodiment will hereinafter be described centering upon unique characteristics different from those of the first embodiment.

Figure 8A:
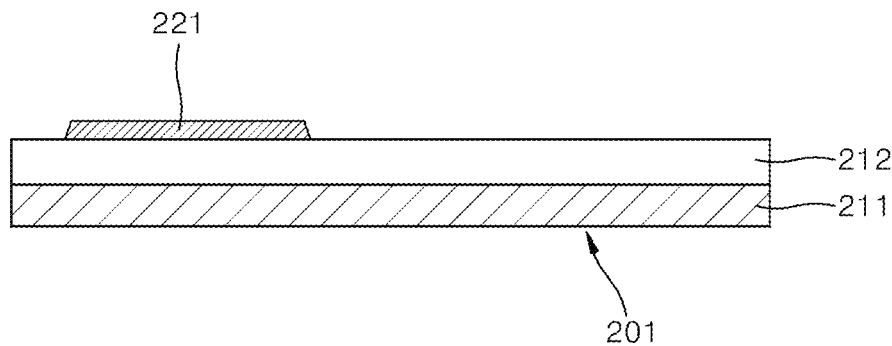
FIGS. 8A to 8I illustrate a method for manufacturing an array substrate for a digital X-ray detector according to a second embodiment of the present disclosure.

An active layer 221 may be formed over a base substrate 211 using a first mask process (see FIG. 8A). In this case, the active layer 221 may be formed in the region in which a thin film transistor will be formed, differently from the first embodiment, and may be formed to expose the region in which the PIN diode 240 will be formed.

Figure 8B:
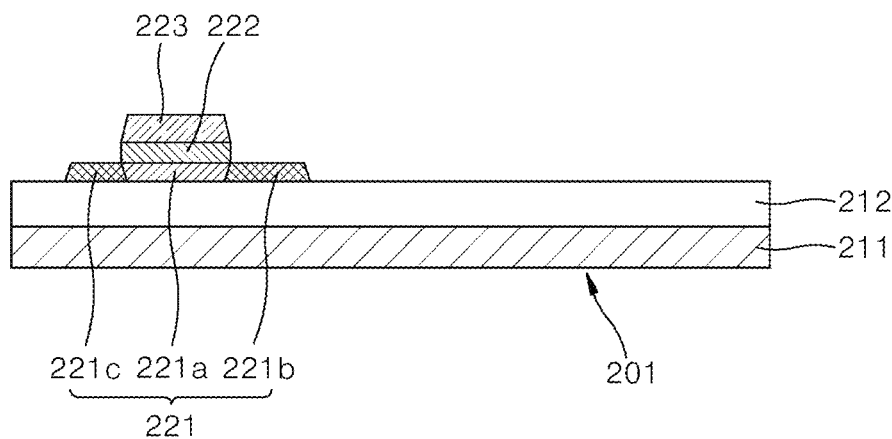
Figure 8C:
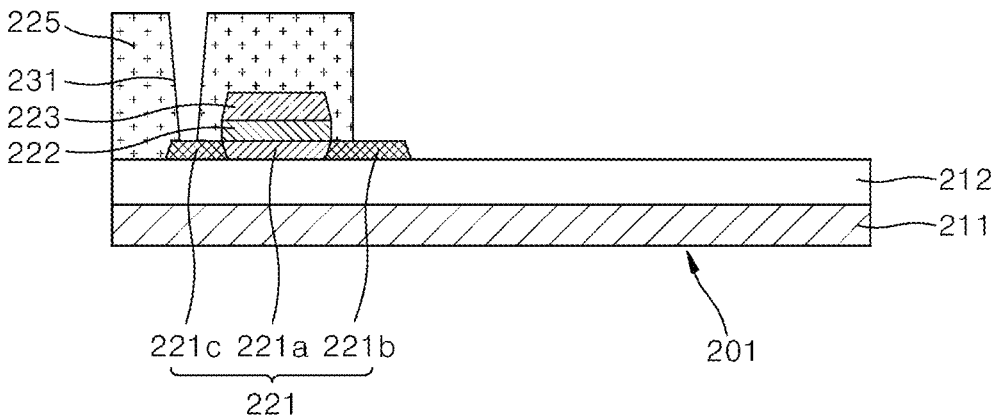

A gate insulation layer 222 and a gate electrode 223 corresponding to a channel region 221a of the active layer 221 may be formed using a second mask process (see FIG. 8B). A source region 221b and a drain region 221c may be formed at one side and the other side of the channel region 221a. Subsequently, the gate electrode 223 and the drain region 221c of the active layer 221 may be covered using a third mask process (see FIG. 8C), and an interlayer insulation layer 225 including a first contact hole 231 corresponding to the drain region 221c may be formed.

Figure 8D:
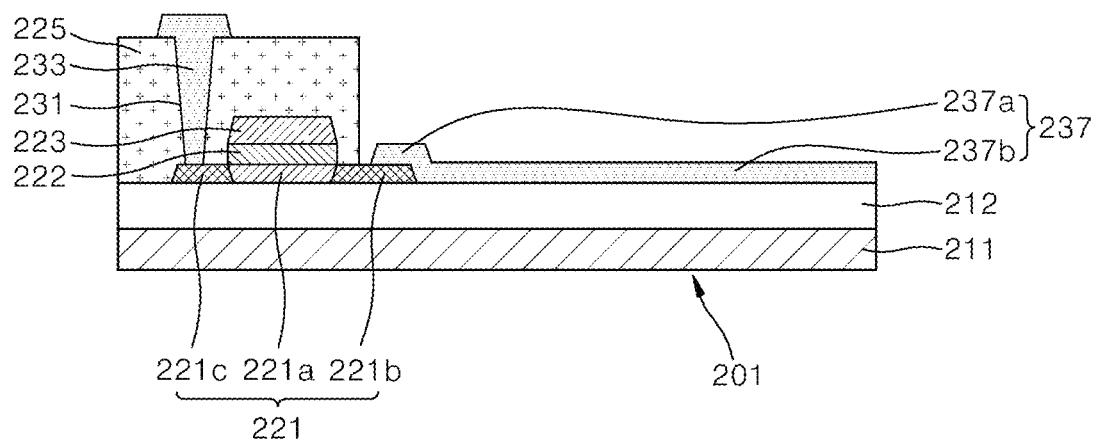

Subsequently, a drain electrode 233 may be formed over the interlayer insulation layer 225 corresponding to the drain region 221c of the active layer 221 using a fourth mask process (see FIG. 8D). Some regions of the lower electrode 237 of the PIN diode 240 may be in surface contact with the source region 221b of the active layer 221. In this case, the drain electrode 233 and the lower electrode 237 may be simultaneously formed by the same patterning process, after formation of the same metal film.

In more detail, the drain electrode 233 may be connected to the drain region 221c of the active layer 221 through a first contact hole 231 included in the interlayer insulation layer 225.

In this case, the region 237a of the lower electrode of the PIN diode 240 may be in surface contact with the source region 221b of the active layer 221, and the remaining region 237b other than the region 237a, that is not in surface contact with the source region 221b, may be formed at the same layer as the active layer 221.

That is, if a buffer layer 212 is formed over the base substrate 211 and the active layer 221 is then formed, the region 237a of the lower electrode may be formed over the source region 221b, and the remaining region 237b may be formed over the buffer layer 212.

In this case, since the entirety of the buffer layer 212 of the active layer 221 is planarized, the lower electrode 237 of the PIN diode 240 formed over the buffer layer 212 may be planarized, such that the lower region of the PIN diode 240 other than the region being in surface contact with the source region 221b of the active layer 221 may be formed without being curved.

Figure 8E:
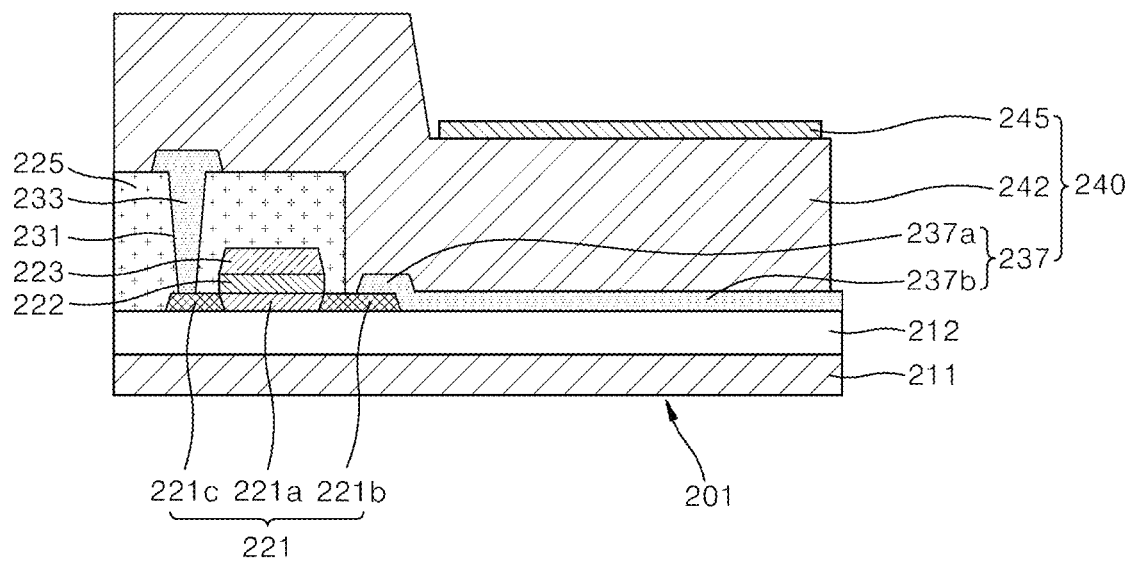
Figure 8F:
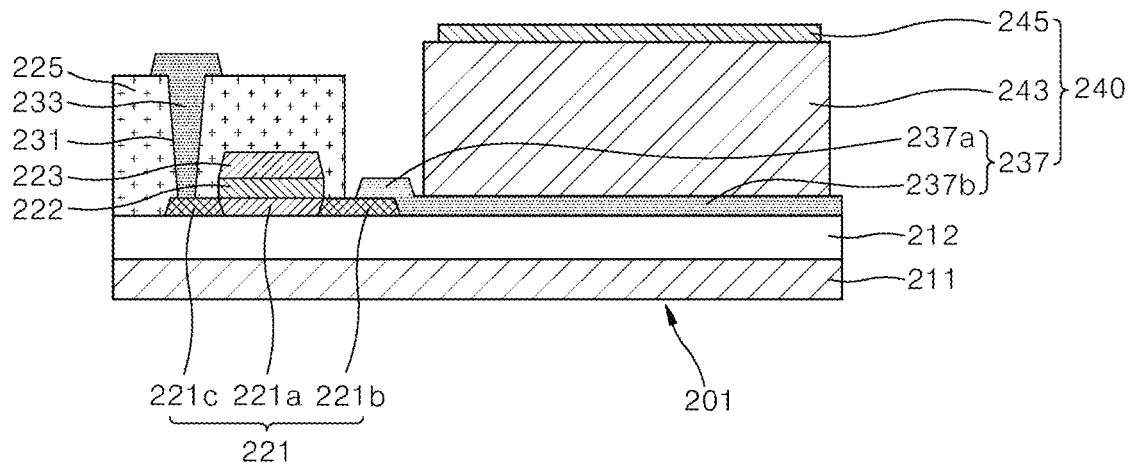

Subsequently, a PIN film 242 may be formed to cover the entire region of the base substrate 211 using a fifth mask process (see FIG. 8E). An upper electrode 245 may be formed over the PIN film 242 corresponding to the remaining lower electrode region 237b not corresponding to the source region 221b of the active layer 221, from among the lower electrode 237 of the PIN diode 240.

The PIN film 242 may be patterned using a sixth mask process (see FIG. 8F), resulting in formation of the PIN layer 243. As a result, the PIN diode 240 including the lower electrode 237, the PIN layer 243, and the upper electrode 245 may be formed.

Figure 8G:
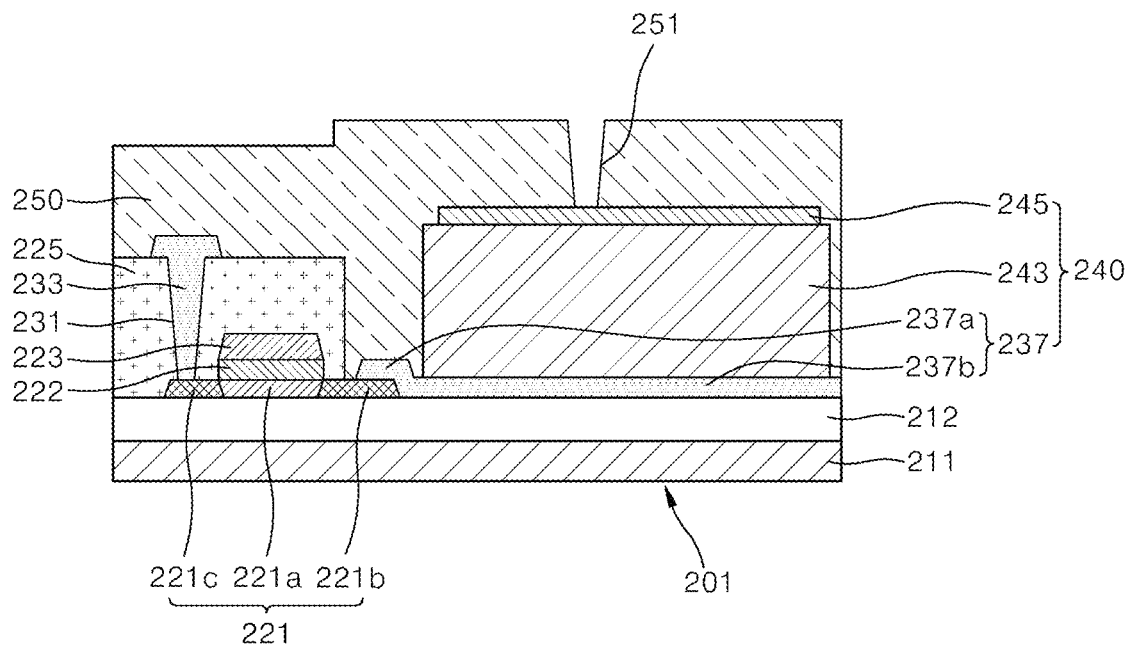
Figure 8H:
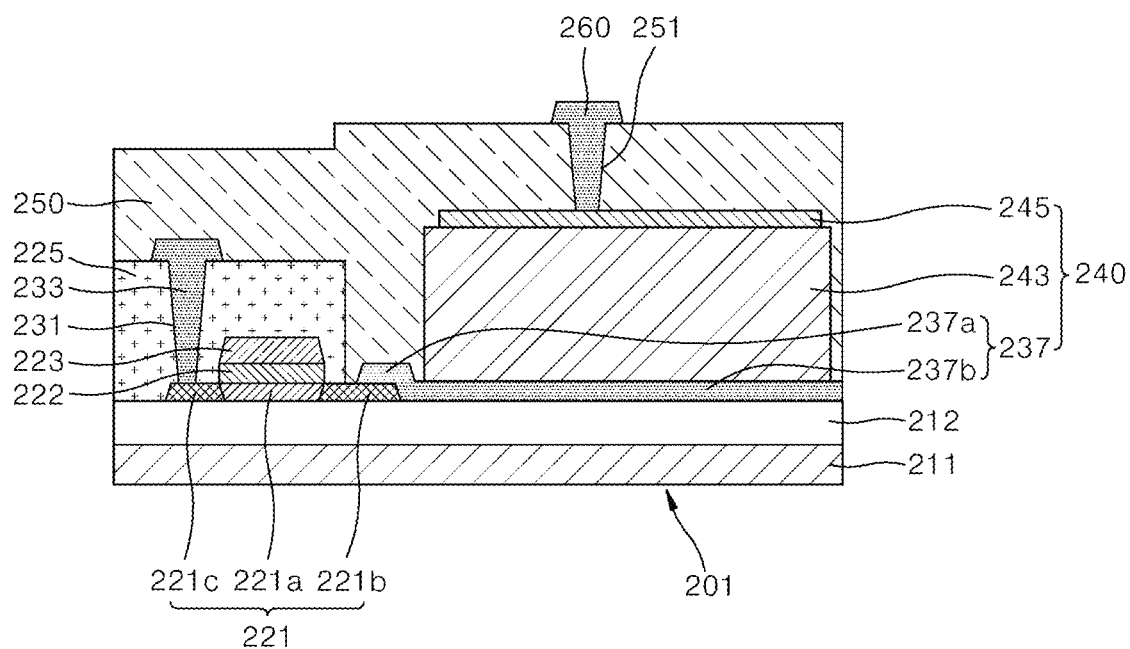
Figure 8I:
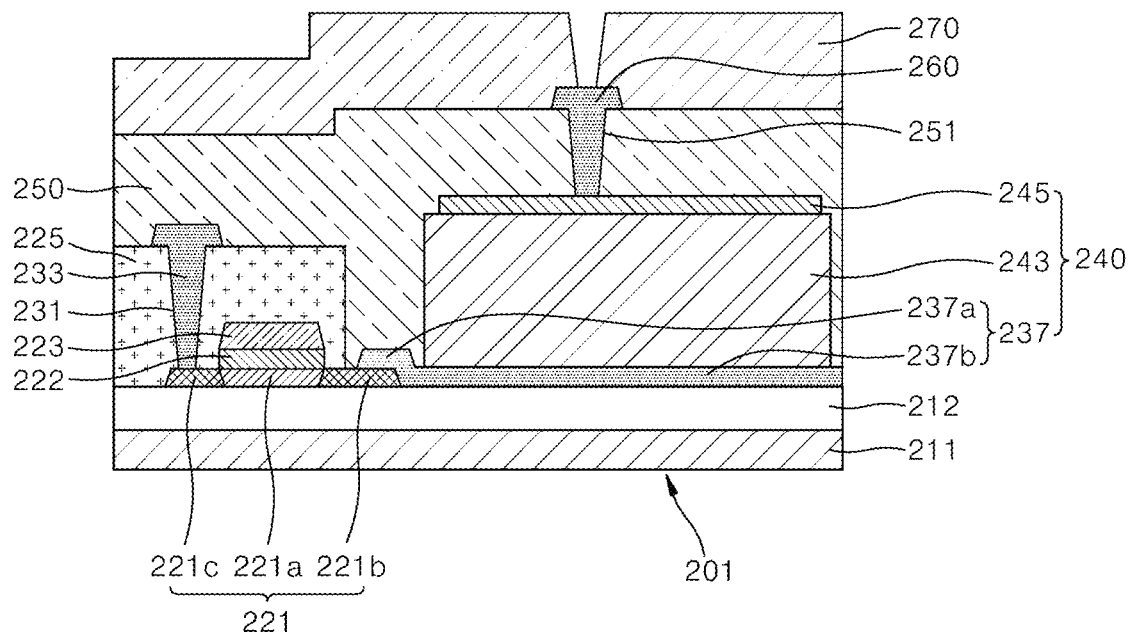

Subsequently, the first protective layer 250, that covers the entire base substrate 211 and has a second contact hole 251, may be formed over the upper electrode 245 of the PIN diode 240 using a seventh mask process (see FIG. 8G). A bias electrode 260 connected to the upper electrode 245 of the PIN diode 240 through the second contact hole 251 of the first protective layer 250 may be formed using an eighth mask process (see FIG. 8H). A second protective layer 270 may be formed to cover the first protective layer 250 having a bias electrode, using a ninth mask process (see FIG. 8I).

As described above, the method for manufacturing the array substrate according to the second embodiment may also be carried out using a total of 9 mask processes up to the process for forming the protective layer covering the bias electrode in the same manner as in the first embodiment, such that the total number of masks needed for overall fabrication is reduced, resulting in improved fabrication efficiency. In this way, the total number of masks needed for overall fabrication is reduced, production costs needed for overall fabrication are reduced and simplified fabrication is implemented, resulting in maximum fabrication efficiency.

As is apparent from the above description, the embodiments of the present disclosure may improve stack coverage by reducing a step difference of the PIN diode, and may reduce off-current of the PIN diode by minimizing the number of cracks formed in a protective layer, such that characteristic deterioration of the PIN diode can be minimized.

The embodiments of the present disclosure may reduce a step difference of the PIN diode, may acquire scintillator characteristics without using a separate planarization process prior to formation of the scintillator, and may improve modulation transfer function (MTF) characteristics by reducing X-ray scattering.

The embodiment of the present disclosure may allow a lower electrode of the PIN diode to be in surface contact with a planarized active layer, and may remove a bent part of a lower region of the PIN diode, such that characteristics of the PIN diode can be improved.

The embodiments of the present disclosure may form the PIN diode even in a region being in surface contact with the active layer, such that a fill factor of the PIN diode can be improved.

The embodiments of the present disclosure reduce production costs and implement simplified fabrication by reducing a total number of masks needed for a fabrication process, resulting in maximum fabrication efficiency.

It will be apparent to those skilled in the art that various modifications and variations can be made in the array substrates for the digital X-ray detector, the digital X-ray detector including the same, and the method for manufacturing the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. An array substrate for a digital X-ray detector, comprising:
    a base substrate;
    an active layer disposed over the base substrate, the active layer including a channel region, a source region and a drain region, the source region and the drain region being respectively formed at one side and the other side based on the channel region;
    a gate insulation layer disposed over the active layer corresponding to the channel region;
    a gate electrode disposed over the gate insulation layer;
    an interlayer insulation layer disposed over the gate electrode and a drain region, the interlayer insulation layer including a contact hole corresponding to the drain region;
    a drain electrode disposed over the interlayer insulation layer, the drain electrode being connected to the active layer through the contact hole; and
    a PIN diode in which a lower electrode, a PIN layer in which an N-type semiconductor layer, an intrinsic semiconductor layer, and a P-type semiconductor layer are sequentially stacked, and an upper electrode are stacked, the PIN diode being in surface contact with the source region of the active layer,
    wherein the lower electrode of the PIN diode is a source electrode connected to the source region of the active layer, and
    wherein the lower electrode is in surface contact with the N-type semiconductor layer and the source region of the active layer.

2. The array substrate of claim 1, wherein the source region of the active layer is in surface contact with an entire region of the lower electrode.

3. The array substrate of claim 2, wherein the lower electrode is disposed over the source region of the active layer.

4. The array substrate of claim 1, wherein the source region of the active layer is in surface contact with some regions of the lower electrode.

5. The array substrate of claim 1, wherein the lower electrode corresponding to the PIN layer is planarized.

6. The array substrate of claim 1, wherein the source region of the active layer is larger in size than the drain region.

7. The array substrate of claim 1, further comprising:
    a bias electrode disposed over the upper electrode such that the bias electrode is connected to the upper electrode,
    wherein the bias electrode is disposed not to overlap the channel region.

8. A digital X-ray detector, comprising:
    an array substrate for the digital X-ray detector according to claim 1; and
    a scintillator disposed over the array substrate.

9. A method for manufacturing an array substrate for a digital X-ray detector, comprising:
    forming an active layer, that includes, not only a channel region, but also a source region and a drain region respectively formed at one side and the other side based on the channel region, over a base substrate;
    forming a gate insulation layer and a gate electrode over the active layer corresponding to the channel region;
    forming an interlayer insulation layer that covers the gate electrode and the drain electrode and includes a first contact hole corresponding to the drain region;
    forming a drain electrode being connected to the drain region through the first contact hole over the interlayer insulation layer;
    forming a lower electrode over the source region such that the lower electrode is in surface contact with the active layer;
    forming a PIN diode including a PIN layer and an upper electrode over the lower electrode;
    forming a protective layer having a second contact hole over the PIN diode; and forming a bias electrode, connected to the upper electrode through the second contact hole, over the protective layer.

10. The method of claim 9, wherein the drain electrode and the lower electrode are formed by the same patterning process.

11. The method of claim 9, wherein the source region of the active layer is larger in size than the drain region.

12. The method of claim 11, wherein an overall region of the lower region is formed over the source region of the active layer.

13. The array substrate of claim 1, wherein the source region and the drain region of the active layer directly contact with the channel region of the active layer.

14. The array substrate of claim 1, wherein the source region and the drain region of the active layer are disposed over the same layer as the channel region of the active layer.

15. The method of claim 9, wherein the lower electrode of the PIN diode is a source electrode connected to the source region of the active layer.

16. The method of claim 9, wherein the source region and the drain region of the active layer directly contact with the channel region of the active layer.

17. The method of claim 9, wherein the source region and the drain region of the active layer are disposed over the same layer as the channel region of the active layer.

\* \* \* \* \*